(12) United States Patent
Umezawa et al.

(10) Patent No.: US 6,740,606 B2
(45) Date of Patent: May 25, 2004

(54) LAMINATED SHEET AND MANUFACTURING METHOD THEREFOR

(75) Inventors: Sadao Umezawa, Kawagoe (JP);
Kihachiro Ishiguro, Kawagoe (JP);
Akira Hiruma, Kawagoe (JP);
Kunihiko Ogawa, Tokyo (JP);
Yoshikane Takagi, Tokyo (JP)

(73) Assignees: Shoritsu Plastics Ind. Co., Ltd., Kawagoe (JP); Kuraray Co., Ltd., Kurashiki (JP)

( * ) Notice: Subject to any disclaimer, the term of this patent is extended or adjusted under 35 U.S.C. 154(b) by 0 days.

(21) Appl. No.: 10/123,196

(22) Filed: Apr. 17, 2002

(65) Prior Publication Data

US 2002/0108704 A1 Aug. 15, 2002

Related U.S. Application Data

(62) Division of application No. 09/012,184, filed on Jan. 22, 1998, now Pat. No. 6,398,899.

(30) Foreign Application Priority Data

Jan. 23, 1997 (JP) .............................. 9-010695

(51) Int. Cl.[7] .......................... B32B 27/12; B32B 27/04
(52) U.S. Cl. .......................... 442/43; 442/58; 442/110; 428/174
(58) Field of Search ....................... 428/174, 366.6; 442/43, 58, 110

(56) References Cited

U.S. PATENT DOCUMENTS 4,755,716 A * 7/1988 Hayafune et al. ........... 313/478
5,218,351 A * 6/1993 Hashikawa ................. 345/30
6,331,349 B1 * 12/2001 Kalinoski et al. .......... 428/220

FOREIGN PATENT DOCUMENTS

JP 06329865 * 11/1994 .......... C08L/33/12

* cited by examiner

Primary Examiner—Ula C. Ruddock
(74) Attorney, Agent, or Firm—Oblon, Spivak, McClelland, Maier & Neustadt, P.C.

(57) ABSTRACT

A laminated sheet having electromagnetic wave shielding effects and a manufacturing method therefor are provided wherein the laminated sheet is transparent, has electromagnetic wave shielding effects and is easily manufactured, moreover, an earthing terminal can be easily connected to the laminated sheet, and post-processing such as ultrasonic adhesion and the like can be easily conducted on the laminated sheet. In the manufacturing method, a conductive mesh-like sheet and a thermoplastic resin sheet are positioned between two molding plates and heated, these sheets are integrally laminated by means of the application of pressure between molding plates. In addition, as the above-mentioned thermoplastic resin sheet, a thermoplastic resin sheet having at least one resin layer which has a thickness which is two times or greater than the thickness of the conductive mesh-like sheet and which has uniform thermal properties is used. In the laminated sheet, at least one side of the conductive mesh-like sheet is imbedded and fixed within the resin layer. It is preferable for the laminated sheet to have exposed portions of conductive mesh formed into a section in which exposed portions of conductive mesh are exposed above the resin layer, on one side.

19 Claims, 3 Drawing Sheets

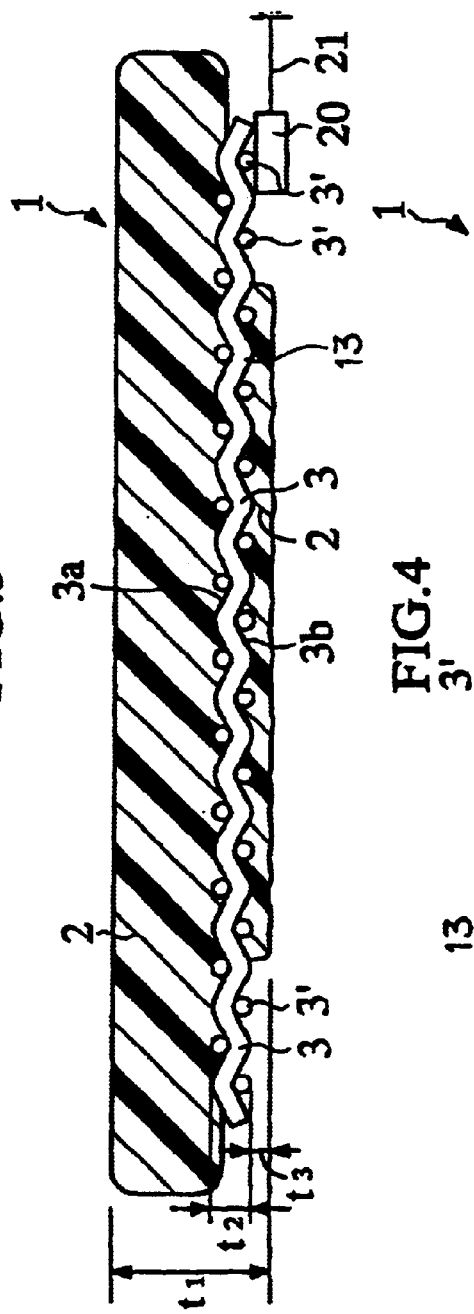
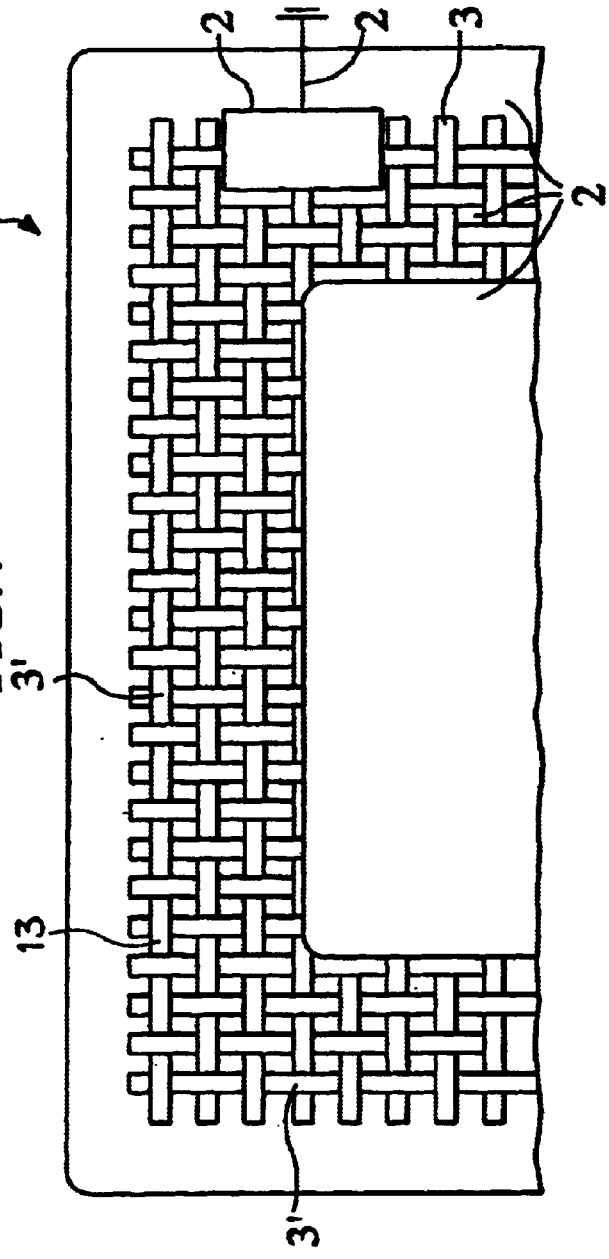

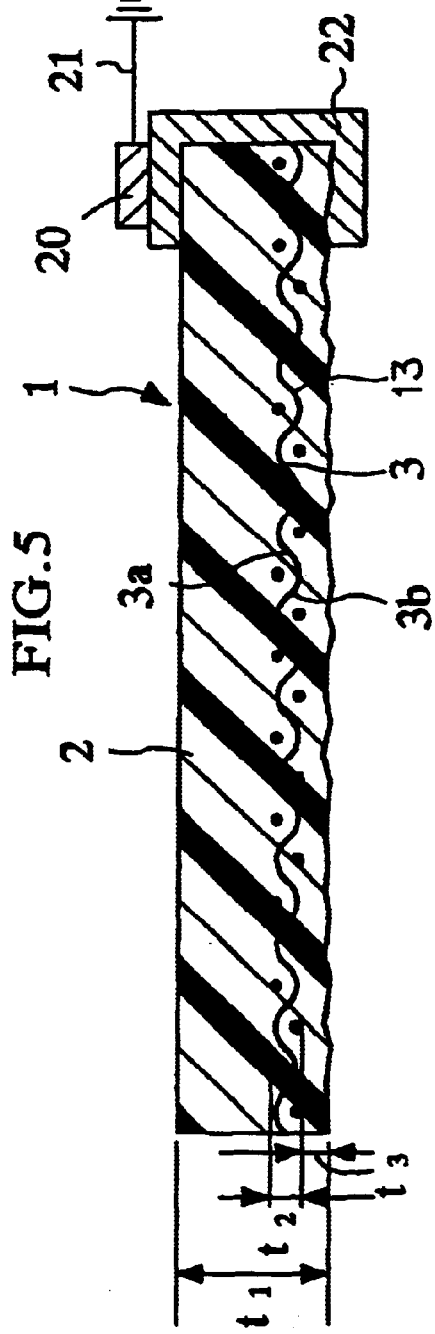
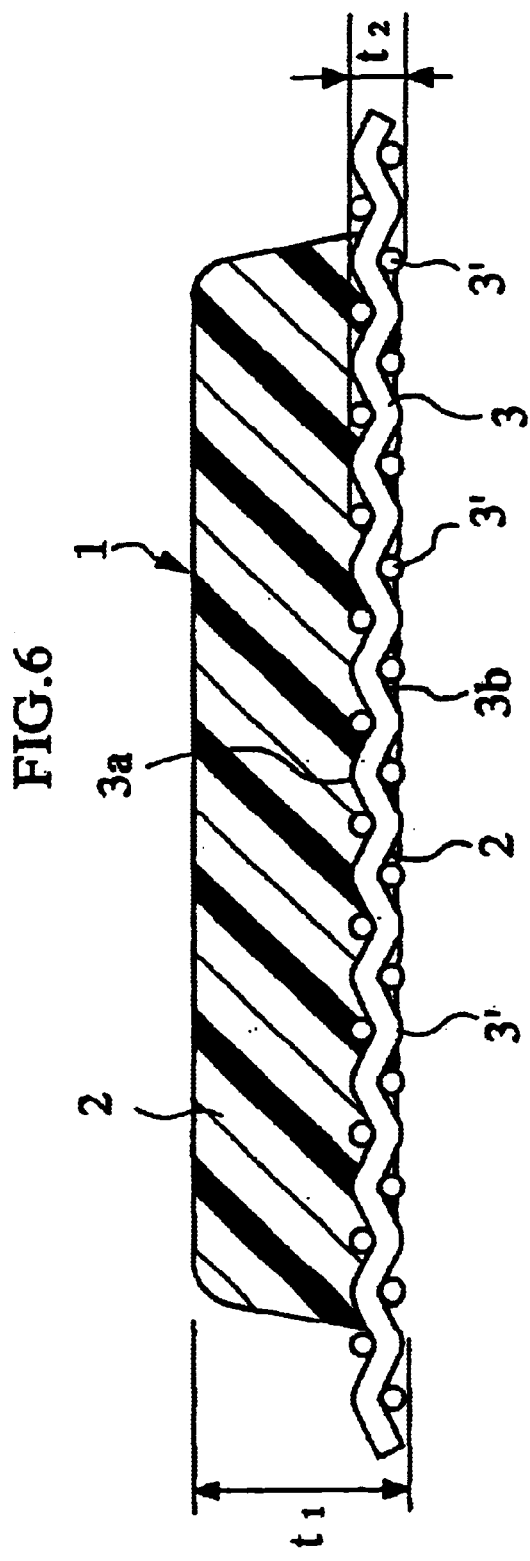

LAMINATED SHEET AND MANUFACTURING METHOD THEREFOR

This application is a division of application Ser. No. 09/012,184, filed Jan. 22, 1998, now U.S. Pat. No. 6,398,899.

BACKGROUND OF THE INVENTION

1. Field of the Invention

The present invention relates to a laminated sheet having electromagnetic wave shielding effects and to a manufacturing method therefor. This application is based on patent application No. Hei 9-10695 filed in Japan, the content of which is incorporated herein by reference.

2. Description of the Related Art

Many electronic devices generate electromagnetic waves and these waves cause problems such as the faulty operation of neighboring devices. For this reason, molded products manufactured using resins which contain conductive materials such as metal powder, carbon black, and the like; molded resin products which have been coated with conductive paint; or products which have been plated are used as housings for electronic devices.

However, with regard to these types of molded products having electromagnetic wave shielding effects, there are problems such that those molded products which have good electromagnetic wave shielding properties have low transparency, while, on the other hand, those molded products which do have high transparency have electromagnetic wave shielding properties which are not satisfactory. In addition, there are also problems in that the fitting of earths, for the purpose of grounding, to molded products having electromagnetic wave shielding effects is difficult, and the process of attaching the earth is complicated.

In addition, as a method for manufacturing a laminated sheet which has transparency and electromagnetic wave shielding effects, a manufacturing method (Japanese Patent Application, First Publication, No. Hei 8-183132) has been proposed in which a thermoplastic resin sheet and a mesh-like sheet are laminated to obtain a laminated sheet by means of using a laminating film.

However, in this method, since a laminating film (having a thickness of 12~50 microns, for example) which is thinner than the conductive mesh-like sheet is used, there are problems in that attention must be given to the prevention of the collection of dust on the laminating film, to the fact that it is easy for bubbles to remain at the interface between the laminating film and the thermoplastic resin sheets, and to the prevention of wrinkling of the laminating film. In addition, since a methacrylic resin (PMMA) sheet is used as the thermoplastic resin sheet, the laminated sheet has the problem that it is lacking in flexibility.

SUMMARY OF THE INVENTION

Consequently, the present invention provides a laminated sheet which has a combination of both transparency and electromagnetic wave shielding properties, and which can be manufactured easily without the use of a laminating film like that mentioned above. In addition, the present invention provides a manufacturing method for this laminated sheet. In addition, it is an object of the present invention to provide a laminated sheet for which it is possible to easily connect an earth to a desirable position of the laminated sheet, and to provide a manufacturing method for this laminated sheet.

Furthermore, another object of the present invention is the provision of a laminated sheet having electromagnetic wave shielding effects, which can be readily cut to the required size, and on which post-processing, such as heat adhesion, ultrasonic adhesion, solvent adhesion or the like, can be easily conducted.

The above-mentioned problems can be solved by a laminated sheet comprising a conductive mesh and at least one thermoplastic resin layer, wherein a part of the conductive mesh is imbedded in the above-mentioned thermoplastic resin layer, and a part of the intersecting points which are a part of the elements making up the conductive mesh are exposed from the above-mentioned thermoplastic resin layer.

In addition, the above-mentioned problems can be solved by means of a laminated sheet in which one side of a conductive mesh is imbedded in a thermoplastic resin layer, wherein the thickness of the above-mentioned thermoplastic resin layer is two times or greater than the thickness of the conductive mesh, and the other side of the conductive mesh is divided into a section which is imbedded within the thermoplastic resin layer and covered by resin and a section in which a part of the conductive mesh is not imbedded in the resin layer and which is exposed from the above-mentioned thermoplastic resin layer.

The laminated sheet of the present invention can be easily manufactured by means of a manufacturing method in which at least one side of a conductive mesh is imbedded in a resin layer, wherein a conductive mesh-like sheet is positioned on a molding plate, a thermoplastic resin sheet which has a thickness which is two times or greater than the thickness of the conductive mesh-like sheet is positioned on the conductive mesh-like sheet, and a molding plate is positioned on the thermoplastic resin sheet, then, in this condition, the thermosoftened thermoplastic resin sheet and the conductive mesh-like sheet are laminated into a single body.

BRIEF DESCRIPTION OF THE DRAWINGS

FIG. 3 is a cross-section of one example of a laminated sheet.

FIG. 4 is a view of the bottom of the laminated sheet shown in FIG. 3.

FIG. 5 is a cross-section of another example of a laminated sheet.

FIG. 6 is a cross-section of yet another example of a laminated sheet.

DESCRIPTION OF THE PREFERRED EMBODIMENTS

Figure 1:
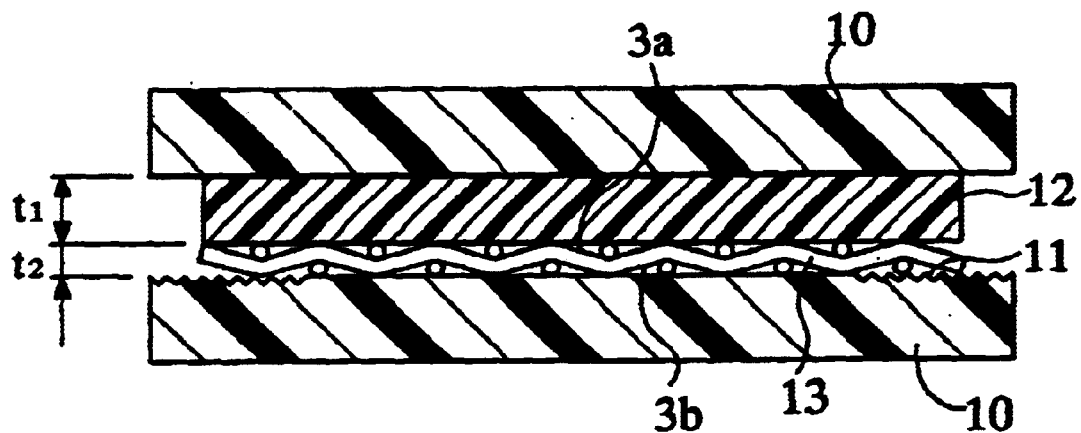
FIG. 1 is a diagram for explaining one example of the manufacturing method for a laminated sheet.
Figure 2:
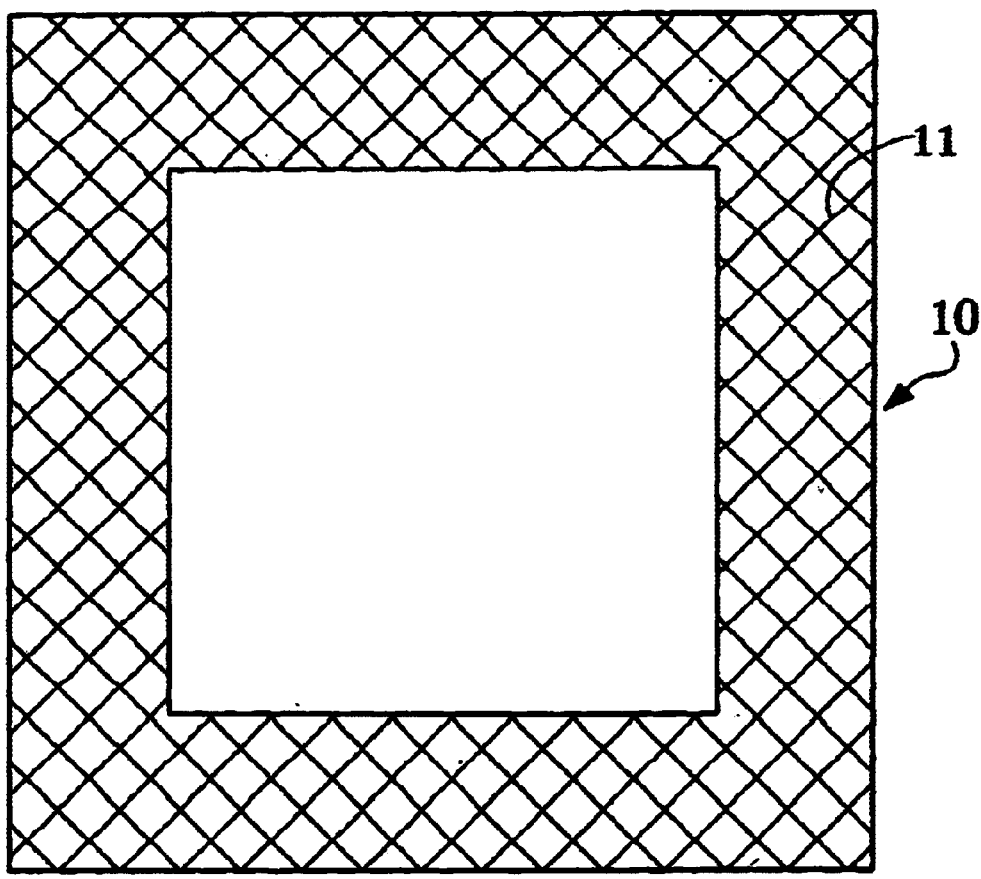
FIG. 2 is a planar view showing an example of a molding plate used in the manufacturing method of the laminated sheet.

In the following, the present invention will be explained further using Embodiments. FIG. 1 and FIG. 2 show an example of the manufacturing method for a laminated sheet according to the present invention. FIG. 3 and FIG. 5 show a representative example of a cross-section of a laminated sheet according to the present invention. FIG. 4 is a view of the bottom of the laminated sheet shown in FIG. 3.

The laminated sheets 1 shown in FIG. 3, FIG. 4 and FIG. 5 are laminated sheets in which at least one side 3a of a conductive mesh-like sheet 13 is imbedded in a thermoplastic resin sheet 12 from one surface of the thermosoftened thermoplastic resin sheet 12 by means of the application of pressure, and at least one side 3a of the conductive mesh 3 is imbedded in a resin layer 2 which has uniform thermal properties and a thickness which two times or greater than the thickness of the above-mentioned conductive mesh 3.

More specifically, the section of the laminated sheet 1 shown in FIG. 3 and FIG. 4 other than the peripheral surface section, and the laminated sheet shown in FIG. 5 are laminated sheets in which both sides 3a and 3b of conductive mesh 3 are imbedded within thermoplastic resin layer 2. The thickness $t_1$ of the resin layer 2 is two times or greater than the thickness $t_2$ of the conductive mesh 3, is preferably three times or greater, and is even more preferably three times to fifty times the thickness of $t_2$. The thickness $t_3$ of the resin which covers the side 3b of conductive mesh 3 is less than the thickness $t_2$ of the conductive mesh 3.

In addition, the resin layer 2 in which at least one side 3a of the conductive mesh-like sheet 13 is imbedded has uniform thermal properties and is formed as a single and continuous layer which extends on both sides 3a and 3b of the conductive mesh 3. In more detail, in the laminated sheet 1 shown FIG. 3 to FIG. 5, the resin layer 2 has uniform thermal properties. In addition, in the section of the laminated sheet 1 shown in FIG. 3 and FIG. 4 other than the peripheral section, and in the laminated sheet 1 shown in FIG. 5, one side 3a and the other side 3b of the conductive mesh 3 are covered by the resin layer 2 which has uniform thermal properties, and the above-mentioned resin layer 2 fills the spaces of the conductive mesh 3, and, in addition, the thermal properties of the resin on the side 3a side and the resin on the other side 3b side are the same. Moreover, the fact that the thermal properties are the same means that the Vicat softening temperature, and the like, are substantially the same.

Furthermore, in the laminated sheet 1 shown in FIGS. 3 and 4, the other side 3b of conductive mesh 3 is divided into a section in which conductive mesh 3 is completely imbedded in the resin layer 2 and covered by the resin layer 2, and a section in which exposed portions 3' of conductive mesh 3 are not imbedded within the resin layer 2 and which are exposed above the resin layer 2.

More specifically, the exposed section having exposed portions 3' is formed on the peripheral surface of laminated sheet 1, and the conductive mesh 3 which is not a part of this peripheral surface is completely imbedded within the resin layer 2 and, thereby, the surfaces of both sides 3a and 3b of the conductive mesh 3 are protected by the resin layer 2.

Since the exposed section is formed at the surface of the edge section, the laminated sheet 1 can be grounded easily by means of connecting an earthing terminal 20 to this section and grounding it using an earthing wire 21. The location at which the exposed section is provided is not particularly limited; and the exposed section can be provided in a section on all sides, three sides, two sides or only one side of the laminated sheet or, alternatively, the exposed section may be provided at a part of the more central section of the laminated sheet. The width of the exposed section can be appropriately adjusted, but it is preferable for the width of this section to be 5 mm or greater, and more preferably 5~30 mm, so that an earthing terminal can be easily connected to the exposed section.

The conductive mesh 3 is the layer which gives conductivity to the laminated sheet.

In order to form the layer of conductive mesh 3 within the laminated sheet, a conductive mesh-like sheet is used. This conductive mesh-like sheet is electrically conductive and has electromagnetic wave shielding properties, and is, for example, a mesh-like sheet of a metal lattice obtained by means of weaving a metal wire such as stainless wire or the like; or is a mesh-like sheet formed by means of weaving synthetic fiber and providing electrical conductivity by means of a process such as electroless plating. The conductive mesh-like sheet is superior in transparency, strength, and the like. In particular, it is preferable for the conductive mesh-like sheet to have a black appearance and to be manufactured from a synthetic fiber by means of weaving a mono-filament synthetic fiber (the diameter of the fiber being approximately 20~100 $\mu$m, and preferably 25~80 $\mu$m) into a net, and giving this net conductive properties by means of covering the net with a metal such as copper, nickel, or the like, of a thickness of approximately 0.1~1.5 microns by means of electroless plating, or the like.

It is preferable for the mesh count of the conductive mesh-like sheet to be approximately 50~200 mesh. The thickness $t_2$ of the mesh-like sheet is approximately 20~180 $\mu$m, and is preferably 30~80 $\mu$m.

Moreover, the mesh count is the number of filaments per one inch of length of conductive mesh-like sheet.

Resin layer 2 is a layer which buries at least one side 3a of conductive mesh 3 and which is for the purpose of preventing deformation such as bending of the conductive mesh 3 by supporting the conductive mesh 3.

Resin layer 2 is formed by using a thermoplastic resin sheet. The preferable shape of the thermoplastic resin sheet is flat.

As the resin for forming the resin layer 2, a resin which has transparency and which is highly adhesive with regard to electrically conductive fiber such as electrically conductive synthetic fiber, metal wire, or the like are preferable. As the resin for forming the resin layer 2, methacrylate resin, olefin-type elastomer, lead-containing acrylic-type resins, and the like are suitable, and these resin are superior in transparency. The resin layer 2 preferably contains 50% by weight or greater of any one of methacrylate resin, olefin-type elastomer, and lead-containing acrylic-type resin. Moreover, lead-containing acrylic-type resins can shield X-rays due to the presence of the lead component.

This resin layer 2 may be colored by means of coloring agents.

Moreover, when imbedding the conductive mesh 3 in the resin layer which has uniform thermal properties and has a thickness which is two times or greater, and preferably three times or greater, than the thickness of the conductive mesh 3, it is possible to imbed the conductive mesh 3 at a uniform depth in the resin layer, and the laminated sheet has excellent surface smoothness.

On the other hand, if the conductive mesh 3 is imbedded in a layer which has uniform thermal properties and which has a thickness which is less than two times the thickness of the conductive mesh 3, it is not possible to imbed the conductive mesh 3 at a uniform depth in the resin layer, the laminated sheet has inferior surface smoothness, and, consequently, the optical properties of the laminated sheet are inferior.

As the above-mentioned olefin-type elastomer, a resin which contains approximately 10 to 100% by weight of hydrogenated elastomer is preferable. Hydrogenated elastomer displays elasticity at room temperature and is superior in transparency and flexibility. As the olefin-type elastomer, mixtures of hydrogenated elastomer and olefin-type resin, such as polyethylene resin, polypropylene resin and the like, can be mentioned.

Examples of hydrogenated elastomer are hydrogenates of block copolymers having polymer block comprising aromatic vinyl compound; block polymer comprising isoprene and/or butadiene; or hydrogenates of styrene-butadiene rubber.

A more preferable example of the resin which forms the resin layer 2 comprises (A) 10 to 90 parts by weight, and preferably 50 to 90 parts by weight, of an acrylic-type resin which has principally methyl methacrylate units and an intrinsic viscosity of 0.1~0.35 dl/g measured in chloroform at 20° C.; and (B) 90 to 10 parts by weight, and preferably 50 to 10 parts by weight, of a hydrogenate of a block copolymer which has (a) polymer block comprising aromatic vinyl compound and (b) polymer block comprising isoprene and/or butadiene. As this type of thermoplastic resin, the acrylic-type thermoplastic resin compositions disclosed in Japanese Patent Application, First Publication, No. Hei 6-329865 are suitable for use. The above-mentioned acrylic-type thermoplastic resin compositions are superior in surface hardness, weather resistance (durability), transparency, flexibility, low temperature characteristics, and the like.

As examples of the (a) polymer block comprising aromatic vinyl compound, there is polymer block obtained by block-polymerizing styrene, α-methylstyrene, or the like. This polymer block (a) has an average molecular weight in the range of 3000~30000 and, in addition, the proportion of this polymer block (a) with regard to the total weight of polymer block (a) and polymer block (b) is preferably in the range of 10 to 60% by weight.

In addition, as examples of the polymer block (b) comprising isoprene and/or butadiene which is in the hydrogenate (B) of block copolymer, polymer blocks in which the weight ratio of isoprene to butadiene (isoprene/butadiene) is in the range of 40/60~100/0, and in which the unsaturated double bonds in the polymer block (b) are hydrogenated, and the percentage of hydrogenation is preferably 70% or greater.

In addition, the average molecular weight of the hydrogenate of the block copolymer is 30000~300000.

FIG. 1 is a diagram for the purpose of explaining an example the manufacturing method for a laminated sheet according to the present invention. The manufacturing method for this laminated sheet is a method for manufacturing a laminated sheet 1 in which at least one side 3a of the conductive sheet 3 is imbedded in the resin layer 2. In this method, a single conductive mesh-like sheet 13 is positioned on a molding plate 10, a single thermoplastic resin sheet 12 is positioned preferably in direct contact with one surface of this conductive mesh-like sheet 13, and another molding plate 10 is positioned on this thermoplastic resin sheet 12. In this condition, the thermoplastic resin sheet 12 and the conductive mesh-like sheet 13 are heated between the molding plate 10 and the molding plate 10 until the thermoplastic resin sheet 12 thermosoftens. Next, by means of applying pressure to the thermoplastic resin sheet 12 and the conductive mesh-like sheet 13 through the molding plates 10 and 10, at least one side 3a of the conductive mesh-like sheet 13 is imbedded in the above-mentioned thermoplastic resin sheet 12 and, thereby, a laminated sheet is produced. At that time, it is important, from the point of view of improving the surface smoothness of the laminated sheet, that a thermoplastic resin sheet having a resin layer having uniform thermal properties and a thickness which is two times or greater, and preferably three times or greater, than the thickness $t_2$ of the conductive mesh 3 be used as the above-mentioned thermoplastic resin sheet 12.

For heating the thermoplastic resin sheet 12, a method in which an oven, a heat press, or the like is used can be used.

In addition, the thermoplastic resin sheet 12 need not be thermosoftened while it is positioned between the molding plates 10, it can be thermosoftened by heating in advance and then positioned between the molding plates 10.

When the thickness $t_1$ of the thermoplastic resin sheet 12 having uniform thermal properties is two times or greater than the thickness $t_2$ of the conductive mesh-like sheet 13, and preferably three times or greater than the thickness of the thickness $t_2$, the thickness $t_1$ of the resin layer 2 of the laminated sheet 1 is two times or greater than the thickness of the conductive mesh 3. When the thickness $t_1$ of the thermoplastic resin sheet 12 is as large as this, at least one side 3a of the conductive mesh-like sheet 13 can be imbedded in the thermoplastic resin sheet 12 at sufficient depth, therefore, the thermoplastic resin sheet 12 and the conductive mesh-like sheet 13 can be laminated into an integrated body with sufficient strength, and for this reason, the conductive mesh 3 of the laminated sheet 1 does not separate from the resin layer 2. In addition, when the thickness $t_1$ is two times or greater than the thickness $t_2$, it is possible for the thermoplastic resin sheet 12 to cover both sides 3a and 3b of the conductive mesh-like sheet 13. Furthermore, since surface irregularities are not formed in both surfaces of the laminated sheet 1, the smoothness of the surfaces of the laminated sheet 1 is not reduced and, as a result, an image seen through the laminated sheet is not distorted. Therefore, the laminated sheet 1 has excellent optical properties. When the thickness $t_1$ of the thermoplastic resin sheet 12 is less than twice the thickness $t_2$ of the conductive mesh-like sheet 13, it is not possible for the thermoplastic resin sheet 12 to cover both sides 3a and 3b of the conductive mesh-like sheet 13, surface irregularities are formed in the surface of the laminated sheet 1, the smoothness of the surfaces of the synthetic resin is lost, and, as a result, the laminated sheet is inferior in its optical properties.

On the other hand, by means of using a molding plate which has fine irregularities on its inner surface, it is possible provide fine irregularities on the surface of the laminated sheet 1, and, as a result, it is possible to give the laminated sheet 1 anti-glare properties.

The preferable thickness $t_1$ of the thermoplastic resin sheet 12 is approximately 0.15~6 mm and the thicker the thermoplastic resin sheet 12, the better the optical properties of the laminated sheet, but the greater the amount of time the thermosoftening of the thermoplastic resin sheet 12 requires.

Moreover, even though the thermoplastic resin sheet 12 is deformed by embedding the conductive mesh-like sheet 13 in the thermoplastic resin sheet 12, since the thickness of the conductive mesh-like sheet 13 is small, the change in the thickness of the thermoplastic resin sheet 12 due to pressure is small. Consequently, the thickness of the thermoplastic resin sheet 12 is approximately equal to the thickness of the resin layer 2 or the thickness of the laminated sheet 1.

In addition, even though pressure is applied to the conductive mesh-like sheet 13, the thickness of the conductive mesh 3 is approximately equal to the thickness of the conductive mesh-like sheet 13.

When thermosoftening the thermoplastic resin sheet 12 together with the conductive mesh-like sheet 13 between the molding plates 10 and 10, it is preferable for the thermoplastic resin sheet 12 to be thermosoftened by heating to a temperature of from 10° C. higher to 60° C. higher than the Vicat softening temperature, of the thermoplastic resin sheet 12, and a temperature of from 20° C. higher to 50° C. higher than the Vicat softening temperature is particularly preferable. When the thermoplastic resin sheet 12 and the conductive mesh-like sheet 13 are heated together, there is no difference in thermal expansion between them, therefore, the conductive mesh-like sheet and the like are not deformed. The Vicat softening temperature of methacrylic resin varies depending on the type and amount of the copolymer components, but is generally 100° C.~120° C. When the thermoplastic resin sheet 12 contains elastomer such as hydrogenated elastomer, it is preferable to heat the thermoplastic resin sheet 12 to a temperature in the range of from the Vicat softening temperature to 30° C. higher than the Vicat softening temperature.

When the thermoplastic resin sheet 12 is heated at a temperature within the above-mentioned temperature range, it is thermosoftened to a rubber state. Consequently, the resin which is thermosoftened to form the resin layer 2 passes through the holes in the net of the conductive mesh-like sheet 13, and is pushed by means of applied pressure from the side 3a of the conductive mesh-like sheet 13 toward the other side 3b of the conductive mesh-like sheet 13. As a result, a laminated sheet in which at least one side 3a of the conductive mesh-like sheet 13 is imbedded in one side of the thermoplastic resin sheet 12 is obtained. In other words, a laminated sheet in which at least one side 3a of the conductive mesh 3 is imbedded and fixed in one side of the resin layer 2 is obtained.

When the applied pressure is large enough, both sides 3a and 3b of the conductive mesh-like sheet 13 are imbedded in the thermoplastic resin sheet 12.

It is preferable for the pressure which is used to be in the range of 30~130 kg/cm². When this value is less than 30 kg/cm₂, it is possible that the conductive mesh-like sheet will not be sufficiently imbedded in the thermoplastic resin sheet. On the other hand, when the pressure exceeds 130 kg/cm², it is possible for the laminated sheet to be deformed. From the point of view of maintaining the shape of the laminated sheet 1, it is preferable for the pressure to be in a range of 50~110 kg/cm².

In addition, the separation of the heating process and the pressure applying process is particularly advantageous. More specifically, a method can be used in which the heating temperature is increased while applying a low pressure of 10~50 kg/cm² to hold the thermoplastic resin and the conductive mesh and prevent slipping; and when the temperature has reached 50~100° C., and preferably 60~90° C., the pressure applying process can be conducted. By means of this type of method, the conductive mesh can be more uniformly imbedded in the thermoplastic resin, and better effects with regard to the prevention of warping and distortion of the mesh can be obtained.

Since the resin which comprises the thermoplastic resin sheet 12 is pushed by applied pressure from one side 3a of conductive mesh-like sheet 13, the thickness $t_3$ of the resin which covers the other side 3b of the conductive mesh 3 of the laminated sheet 1 is smaller than the thickness $t_2$ of the conductive mesh 3. Thickness $t_3$ is generally about 0.005~0.03 mm. In this way, since the thickness $t_3$ is small, it is possible to remove the resin covering the side 3b by means of polishing using buffing cloth, polishing paper, or the like. Consequently, in accordance with need, it is possible to expose, above the resin layer 2, the conductive mesh 3 at the side 3b which has been covered by the resin layer 2 by means of polishing. As a result, even after cutting the laminated sheet to a desired size, it is possible to easily connect an earthing terminal to this cut product.

The thermoplastic resin sheet 12 goes into a rubbery state due to being heated to within the above-mentioned temperature range, but it does not melt, therefore, the smoothness of the surface of the above-mentioned sheet 12 is not lost even though this sheet 12 is in contact with the molding plate 10. In addition, the conductive mesh-like sheet 13 is not deformed by means of the melting and flowing. In other words, the form of the net of the conductive mesh-like sheet 13 is maintained after the application of pressure.

The conductive mesh-like sheet 13 can be positioned above or below the thermoplastic resin sheet 12, but if it is positioned below the thermoplastic resin sheet 12 as shown in FIG. 1 and then pressure applied, it is possible to obtain a laminated sheet which does not contain bubbles.

As the molding plate 10 for heating and applying pressure to the thermoplastic resin sheet 12 and the conductive mesh-like sheet 13, a flat metal plate with high rigidity is preferable, and a flat metal plate having a specular surface is particularly preferable.

In addition, it is preferable for a rubber cushion material to be arranged on the outer side of either of the bottom molding plate 10 or the top molding plate 10 and preferably on the outer side of both of the bottom molding plate 10 and the top molding plate 10 shown in FIG. 1. When a rubber cushion material is arranged on the outer side of molding plates 10, the pressure applied by the platen of the press, or the like, is passed through the rubber cushion material and is transmitted uniformly to the molding plate 10. As a result, the thermoplastic resin sheet 12 and the conductive mesh-like sheet 13 which have been positioned between the molding plate 10 and the molding plate 10 can be pushed at a more uniform pressure. Consequently, by using a rubber cushion material, it is easier to obtain a laminated sheet which is superior in surface smoothness. As the rubber cushion material, a sheet of rubber, such as chloroprene rubber or silicone rubber, which has a thickness in the range of approximately 1~10 mm can be mentioned.

In addition, the laminated sheet of the present invention is manufactured by means of a manufacturing method in which a thermoplastic resin sheet and a conductive mesh-like sheet are positioned between a pressure applying body and a pressure applying body, and the conductive mesh-like sheet is imbedded in the thermosoftened thermoplastic resin sheet from one side of the above-mentioned thermoplastic resin sheet by means of the application of pressure and, thereby, a laminated sheet in which at least one side of the above-mentioned conductive mesh-like sheet is imbedded in the above-mentioned thermoplastic resin sheet. In a more preferable manufacturing method for the laminated sheet of the present invention, at least one of said pressure applying bodies has a plurality of sections in which the surface roughness is different, and a part of the above-mentioned thermoplastic resin sheet and a part of the above-mentioned conductive mesh-like sheet are positioned on one of those plurality of sections in which the surface roughness is great, and at least one side of the above-mentioned conductive mesh-like sheet which is on this section, in which the surface roughness is great, is imbedded in the thermoplastic resin sheet. In this method, as the pressure applying body, a heat roller, a molding plate, and the like can be mentioned, but a molding plate is preferable. When the pressure applying body is a molding plate, it is particularly easy for at least one side of the conductive mesh-like sheet to be imbedded at a uniform depth in the thermoplastic resin sheet, and, as a result, it is possible to obtain a laminated sheet which is superior in transparency.

As shown in FIG. 1 and FIG. 2, the section in which the surface roughness is great is preferably formed as a section on the surface of molding plate 10 as an air escaping section 11 for the purpose of allowing the air between the thermoplastic resin sheet 12 and the molding plate 10 to escape. In addition, it is preferable for the air escaping section 11 to be formed as a section (a rough surface section) having a surface which has greater roughness than that of other surface sections of the molding plate 10 and, in particular, is formed having fine irregularities which have a depth which is smaller than that of the thickness $t_2$ of conductive mesh-like sheet 13. Furthermore, it is preferable for the above-mentioned air escaping section 11 to be formed on the outer periphery of the molding plate 10 in such a way that the above-mentioned air escaping section 11 is continuous with the edge of the surface of molding plate 10.

Preferably, the air escaping section 11 is formed by means of carrying out sand blasting, chemical etching, or the like, on the surface of molding plate 10. It is preferable for the width of the air escaping section 11 to be 5 mm or greater. As the abrasive agent used in the above-mentioned sand blasting process, abrasive agents which are usually used in sand blasting, such as carborundum and glass beads, can be used. A particle size for the abrasive agent in the range of #300~#1200 using product identifying numbers is effective, and in the range of #500~#1200 is particularly preferable.

In addition to preventing the air from remaining in the laminated sheet 1 and forming bubbles, the air escaping section 11 makes it possible to manufacture a laminated sheet to which an earthing terminal 20 can be easily connected.

Since there is a section of fine irregularities in the air escaping section 11, the applied pressure at the air escaping section is less. Therefore, it is difficult for the resin to be pushed by pressure to the lower side 3b of the conductive mesh-like sheet 13 which is positioned on the air escaping section 11. Consequently, by providing an air escaping section 11 in the molding plate 10, in the surface of the laminated sheet 1 which was positioned above the air escaping section 11, the side 3a of the conductive mesh 3 is imbedded in the resin layer 2, but the exposed portions 3' of conductive mesh 3 are reliably formed in the other side 3b of the conductive mesh 3.

When the air escaping section 11 is formed in the surface of the peripheral section of molding plate 10 as shown in FIG. 2, it is possible to easily form a section having exposed portions 3' of conductive mesh 3 on the four edge sections of the surface of the laminated sheet 1 as shown in FIGS. 3 and 4. Consequently, it is possible to manufacture a laminated sheet 1 to which an earthing terminal can be easily connected.

In addition, since the air escaping section 11 presses the conductive mesh-like sheet 13 during the application of pressure, deformation of the conductive mesh-like sheet 13 during the application of pressure is prevented.

If an air escaping section 11 having too great a depth is formed in the molding plate 10, the molding plate 10 easily warps, but if the rough surface is formed by means of sand blasting or the like, the molding plate 10 does not warp.

FIG. 6 is a cross-section of another example of the laminated sheet of the present example.

Since the amount of resin which is pushed through to the other side 3b of the conductive mesh-like sheet 13 depends on the applied pressure, simply by moderately adjusting the applied pressure, it is possible to manufacture the laminated sheet 1 shown in FIG. 6. This laminated sheet 1, is a laminated sheet obtained by thermosoftening a thermoplastic resin sheet 12 which has a resin layer 2 which has uniform thermal properties and a thickness which is two times or greater than the thickness $t_2$ of the conductive mesh-like sheet, and imbedding and fixing one side 3a of the conductive mesh-like sheet in the thermoplastic resin sheet 12 from one side of the above-mentioned thermoplastic resin sheet 12 by means of the application of pressure. A part of the fibers of the conductive mesh 3, more specifically, exposed portions 3' of the cross points of the conductive mesh, are exposed from the laminated sheet. For the type of laminated sheet shown in FIG. 6, with regard to the cross points of the conductive mesh, not all of the cross points are imbedded within the resin layer of the thermoplastic resin sheet and, as shown, many are exposed from the thermoplastic resin sheet.

In particular, on the side 3b, when 50% or greater of the cross points of the conductive mesh 3 are exposed from the side 3b, even when the laminated sheet 1 is cut to a desired size, it possible to electrically connect an earthing terminal to the side 3b and, as a result, cut products can be reliably grounded, therefore, this situation is preferable. For this reason, it is particularly preferable for 50% or greater of the cross points of the conductive mesh 3 to be uniformly exposed across the whole surface of side 3b.

Moreover, in the laminated sheet shown in FIG. 6, when the thickness $t_1$ of the resin layer 2 which has uniform thermal properties is two times or greater than the thickness $t_2$ of the conductive mesh 3, and preferably three times or greater, the surface of the side 3b of the conductive mesh is superior in smoothness and, for this reason, the laminated sheet 1 has excellent optical properties.

In the method for manufacturing the laminated sheet of the present invention, it is possible to directly imbed at least one side of conductive mesh 3 within the resin layer 2 without the use of an adhesive or a laminating film. Since neither an adhesive nor a laminating layer are required, it is possible to prevent a reduction of the electrical property, to prevent the surface from becoming dirty due to the adhesive being forced out, and to prevent uneven rising to the surface and sinking of the sheet due to the adhesive. As a result, the manufacture of the laminated sheet is easy and the laminated sheet which is obtained is superior in quality.

The laminated sheet of the present invention can be suitably used as a covering material for medical devices, front plates for CRTs, covering material for portable telephones, anti-static boxes, and the like.

EMBODIMENTS

In the following, the present invention will be explained in greater detail.

Embodiment 1

In the following way, the laminated sheet 1 having the structure shown in FIGS. 3 and 4 is manufactured according to the manufacturing method of the present invention.

As the thermoplastic resin sheet 12, a methacrylic resin sheet manufactured by Kuraray Co., Ltd. was prepared. The Vicat softening temperature (according to ASTM-D1525) of this methacrylic resin sheet was 118° C. and the total light transmission ratio was 92%. This methacrylic resin sheet is a flat sheet having uniform thermal properties, the entirety of which comprises methacrylic resin.

In addition, as conductive mesh-like sheet 13, a mesh-like sheet was formed by weaving a mono-filament (0.040 mm in diameter) of polyester fiber lengthwise and crosswise, then the mesh-like sheet was made by electroless plating with nickel and copper, additionally, a black special paint was coated, and thereby a mesh-like sheet having a black external appearance was prepared. The mesh count of this conductive mesh-like sheet (having a thickness of approximately 0.06 mm) was 135 mesh and the resistance value over 100 cm was 4Ω (25° C.).

As the molding plate, two metal specular plates 10 and 10 were prepared. On the four peripheral edges of the surface of one molding plate 10, an air escaping section 11 as shown in FIG. 2 was formed.

Air escaping section 11 was formed by sand blasting the peripheral portion of the surface of the molding plate 10 and, thereby, the roughness of the section was increased.

Then, as shown in FIG. 1, one sheet of the above-mentioned conductive mesh-like sheet 13 was positioned in contact with the surface of the molding plate 10 in which the air escaping section 11 was formed, one sheet of methacrylic resin sheet 12 was positioned in contact with the other surface of this sheet 13, and molding plate 10 was positioned in contact with the other surface of this methacrylic resin sheet 12. In this condition, the conductive mesh-like sheet 13 and the methacrylic resin sheet 12 were heated to 140° C. (the Vicat softening temperature plus 32° C.) and thereby the methacrylic resin sheet 12 was thermosoftened.

In addition, the conductive mesh-like sheet 13 was 0.060 mm in thickness, 500 mm in width and 500 mm in length. The methacrylic resin sheet 12 was 1.00 mm in thickness, 540 mm in width, and 540 mm in length.

In addition, as shown in FIG. 1, the external parts of the methacrylic resin sheet 12 and conductive mesh-like sheet 13 were positioned in such a way as to overlap over the air escaping section 11.

Next, with conductive mesh-like sheet 13 and methacrylic resin sheet 12 positioned between molding plate 10 and molding plate 10, they were positioned between the heating platens of a compression molding machine (not shown in the diagrams), pressure was applied at a force of 100 kg/cm² and at 140° C., at least one side of the conductive mesh-like sheet 13 was imbedded in the thermosoftened methacrylic resin sheet 12 from one side of the thermosoftened methacrylic resin sheet 12, and, thereby, the conductive mesh-like sheet 13 and the methacrylic resin sheet 12 were integrated into a laminate. Next, the laminate product was cooled from 140° C. to approximately 50° C. The mold was then opened and the laminated sheet which was the laminated product was removed from between the molding plates 10 and 10. By means of the above-mentioned method, a plurality of laminated sheets were manufactured.

As shown in FIGS. 3 and 4, in the center of the above-mentioned laminated sheet, the conductive mesh 3 is imbedded within a uniform resin layer 2 of methacrylic resin; both sides 3a and 3b of the conductive mesh 3 are covered by methacrylic resin of uniform thickness; and the above-mentioned laminated sheet 1 does not contain bubbles. In addition, both surfaces of the above-mentioned laminated sheet 1 have a surface smoothness such that it is possible for indoor ceiling fluorescent lighting to be reflected in a straight line manner in that surface.

In addition, laminated sheet 1 is a flat sheet in which one side 3a of a conductive mesh 3 is imbedded in one side of a methacrylic resin layer 2. The thickness $t_1$ of the methacrylic resin layer 2 was 1.02 mm and this is two times or greater than the thickness $t_2$ (0.05 mm) of the conductive mesh 3. The other side 3b of the conductive mesh 3 is divided into a section in which a part of conductive mesh 3 is imbedded within methacrylic resin layer 2 and covered by methacrylic resin, and a section in which exposed portions 3' of conductive mesh 3 are uniformly exposed above methacrylic resin layer 2. The thickness $t_3$ of the methacrylic resin which covers the other side 3b of conductive mesh 3 was uniformly 0.02 mm, and this is thinner than the thickness $t_2$ (0.05 mm) of conductive mesh 3. In addition, the width of the section having the exposed portions 3' of conductive mesh 3 was approximately 15 mm. The laminated sheet 1 was cut to a width of 5 cm and the electrical resistance over 50 cm was measured, giving a result of 3Ω (20° C.). In other words, the obtained laminated sheet has an electrical resistance value which is sufficiently low and is excellent in electromagnetic wave shielding properties.

This laminated sheet 1 was rigid, it was grounded by the connection of an earthing terminal 20 to the edge section of the side 3b of conductive mesh 3, and it was used as the front surface plate of a plasma display.

The above-mentioned laminated sheet was cut to a desired size and, as shown in FIG. 5, a laminated sheet 1 was made in which both sides 3a and 3b of conductive mesh 3 were imbedded in one side of the methacrylic resin layer 2.

An electric busbar structure 22 was formed on the above-mentioned cut laminated sheet 1 by the application of an electrically conductive paint containing copper powder to both edge surfaces thereof. An earthing terminal 20 was electrically connected to this electric busbar structure 22, this earthing terminal 20 was grounded via earthing wire 21, and then the thus obtained product was used as a CRT front plate. It was possible to see an image through the CRT.

Alternatively, a CRT front plate was manufactured using a different method in which an electrically conductive paint was not used.

More specifically, the above-mentioned laminated sheet was cut to the desired size, a portion of the external surface on the conductive mesh side 3b of the cut product was polished using polishing paper and, thereby, the methacrylic resin layer 2 (thickness 0.01 mm) covering the side 3b was removed, and portions of the conductive mesh were exposed above the resin layer 2. An earthing terminal was connected to these exposed portions of the conductive mesh and, thereby, a board-like product was made. This board-like product was arranged on the front surface of a CRT, the earthing terminal grounded, and a CRT front plate formed.

Embodiment 2

This embodiment was conducted in the same way as Embodiment 1 with the exception that the applied pressure was 83 kg/cm² in place of the applied pressure of 100 kg/cm² used in Embodiment 1. A rigid laminated sheet having the structure shown in FIG. 6 was obtained. In other words, simply by means of varying the applied pressure, it is possible to manufacture both of the laminated sheets shown in FIG. 3, FIG. 4 and FIG. 6.

As shown in FIG. 6, the laminated sheet 1 of the present embodiment is a flat sheet in which one side 3a of a conductive mesh 3 is completely imbedded in one side of the resin layer (methacrylic resin layer) 2. The thickness $t_1$ (approximately 1.0 mm) of the resin layer 2 is two times or greater than the thickness $t_2$ (approximately 0.05 mm) of the conductive mesh 3. In this flat sheet, the other side 3b of the conductive mesh 3 is not completely covered by resin, and exposed portions 3' of the conductive mesh 3 are uniformly exposed across the whole side 3b from the resin. In addition, as shown in FIG. 6, for approximately 100% of the cross points of the conductive mesh 3, exposed portions 3' of the fibers of the top of the cross points are exposed above resin layer 2.

A plurality of laminated sheets of this embodiment were manufactured. Then, a box container for housing an IC wafer was made by adhesion by means of an ultrasonic wave process. In addition to having electromagnetic wave shielding properties, this box had antistatic properties.

Embodiment 3

A laminated sheet having a structure like that shown in FIG. 3 and FIG. 4 was manufactured in the following way.

As the thermoplastic resin sheet 12, an acrylic-type sheet (a flat sheet having a thickness 0.2 mm) containing olefin-type elastomer was prepared. This sheet contained (A) 70 parts by weight of an acrylic-type resin which had principally methyl methacrylate units (NIMA 90 mol %) and had an intrinsic viscosity of 0.3 dl/g measured in chloroform at 20° C., and (B) 30 parts by weight (30% by weight) of a hydrogenate (hydrogenated elastomer) of block copolymer having (a) polymer block comprising aromatic vinyl and (b) polymer block comprising isoprene and butadiene. This acrylic-type sheet was elastic at 25° C., had a total light transmission ratio of 90%, had a broke when elongated to 180% at 25° C., and had a Vicat softening temperature of 61° C.

The above-mentioned acrylic-type sheet and the conductive mesh-like sheet 13 of Embodiment 1 were heated to 110° C. (a temperature of the Vicat softening temperature plus 49° C.) between two molding plate 10 and 10. Next, the conductive mesh-like sheet 13 and the acrylic-type sheet were integrally laminated in the same way as in Embodiment 1 with the exception that the applied pressure was 95 kg/cm$^2$, and, thereby, a soft laminated sheet was manufactured.

As shown in FIGS. 3 and 4, the obtained soft laminated sheet 1 is a flat sheet in which one side 3a of conductive mesh 3 is imbedded in one side of uniform resin layer 2 which comprises acrylic-type resin containing hydrogenated elastomer. The thickness $t_1$ of the resin layer 2 was approximately 0.2 mm and the thickness $t_2$ of the conductive mesh 3 was 0.05 mm. The other side 3b of the conductive mesh 3 is divided into a section in which conductive mesh 3 is completely imbedded in the resin layer 2 and covered by acrylic-type resin, and a section in which exposed portions 3' of conductive mesh 3 which are not imbedded within the resin layer 2 is exposed above resin layer 2. The thickness $t_3$ of the acrylic-type resin which covers the other side 3b of the conductive mesh 3 was 0.02 mm.

The above-mentioned soft laminated sheet 1 was cut to a size of 5 cm in width and 30 cm in length. An electric busbar structure 22 was formed by the application of an electrically conductive paint containing copper powder to both edge surfaces thereof. The electrical resistance between electric busbar structures 22 and 22 (at an interval of 30 cm) was measured; the result was 6Ω and, therefore, the electromagnetic wave shielding properties were excellent. In addition, it was also confirmed that there was no severance of the conductive fibers which make up the conductive mesh.

The obtained laminated sheet was soft at 25° C., it was flexible such that it could withstand folding and bending of 100 times and greater, it had flexibility such that it could be easily bent by hand to a radius of curvature of 1 mm or less, and it could be easily cut using sewing scissors.

After manufacturing a plurality of soft laminated sheets, they were cut to a desired size, adhered using ultrasonic waves, and a bag-shaped cover was made. An earthing terminal was connected to the side 3b of the mesh of this cover, and an earthing wire was connected to this earthing terminal. This bag was used as an electromagnetic wave shielding cover material for medical devices.

Embodiment 4

As the thermoplastic resin sheet 12, an olefin-type elastomer sheet containing 40 parts by weight of JSR DYNARON (product name; registered trade mark) manufactured by Japan Synthetic Rubber Co. Ltd., and 60 parts by weight of polypropylene was prepared. The thickness of this sheet was 0.2 mm. JSR DYNARON is hydrogenated styrene-butadiene rubber.

This olefin-type elastomer sheet and a conductive mesh-like sheet the same as that used in Embodiment 1 were used and a laminated sheet was obtained in the same way as in Embodiment 2. However, the heating temperature was 110° C. and the applied pressure was 75 kg/cm$^2$.

As shown in FIG. 6, this laminated sheet 1 is a flat sheet in which the side 3a of the conductive mesh 3 is imbedded within the resin layer 2 which contains 40% hydrogenated styrene-butadiene rubber, and the other side 3b of conductive mesh 3 has many exposed portions 3' of conductive mesh 3 which is uniformly exposed across the entire side 3b above the resin layer 2.

The flexibility of this laminated sheet of the present Embodiment 4 is inferior to that of laminated sheet of Embodiment 3 but it is superior to that of the laminated sheet of Embodiment 1.

After cutting this laminated sheet to a desired size, it was fitted to the window of a portable telephone and it was possible to use it as an electromagnetic wave shielding window.

Embodiment 5

In the following way, the laminated sheet 1 shown in FIG. 3 and FIG. 4 was manufactured.

As the thermoplastic resin sheet 12, a flat acrylic resin sheet which had a transparency of 75% for all light and was smoke-colored was prepared. This acrylic resin sheet was manufactured by Kuraray Co., Ltd. by means of extrusion molding, and it was a flat sheet comprised totally of methacrylic resin and had uniform thermal properties.

On the other hand, as the conductive mesh-like sheet, a conductive mesh-like sheet having a black external appearance was prepared by electroless plating of the surface of a cloth with copper and then applying a special black paint, wherein the cloth had an even weave in which the cross-wise and lengthwise threads were monofilaments having a diameter of 40 μm. This black conductive mesh-like sheet was transparent, had a mesh count of 100 mesh and a thickness of 55 μm.

As the cushion material, a 3 mm thick sheet of silicon rubber was positioned on the surface of a metal plate which was the supporting body for the cushion material, and as the bottom molding plate 10, a stainless steel plate was positioned on the above-mentioned silicone rubber sheet. This bottom stainless steel plate is square and, as shown in FIG. 2, has an air escaping section 11 of 20 mm in width formed in the surface along all four edges of thereof. This air escaping section 11 was formed by means of a sand blasting process.

Onto this bottom molding plate 10, as shown in FIG. 1, the above-mentioned black conductive mesh-like sheet was positioned as the conductive mesh-like sheet 13, and onto this conductive mesh-like sheet 13, the above-mentioned smoke-colored acrylic resin sheet was positioned as the thermoplastic resin sheet 13. At this time, as shown in FIG. 1, the peripheral sections of the methacrylic sheet 12 and the black conductive mesh-like sheet 13 were position on the air escaping section 11.

In addition, onto the above-mentioned thermoplastic resin sheet 12, a stainless steel plate was positioned as the top molding plate 10, onto this molding plate 10, a silicone sheet was additionally positioned and, thereby, a sandwich structure is obtained. This sandwich structure was then positioned between the top and bottom platen of a heat press (the temperature of the platen was 150° C.), then the sandwich structure was pressed at a pressure of 40 kg/cm² by the platen. Next, the sandwich structure was moved and positioned between cooling platen, and cooled. Then, a laminate of the black conductive mesh-like sheet and the smoke colored acrylic resin sheet was removed and, thereby, a laminated resin sheet 1 was obtained.

The obtained laminated sheet 1 was a flat sheet manufactured by imbedding the black conductive mesh-like sheet 1 in one side of the thermosoftened acrylic resin sheet 12, and by filing the spaces in the black conductive mesh-like sheet with the resin layer 2 of the acrylic resin sheet 12. As shown in FIG. 3 and FIG. 4, this laminated sheet 1 was a flat sheet, in the center section of which, both sides 3a and 3b of the conductive mesh 3 were buried within the acrylic resin layer 2; the thickness $t_1$ (approximately 3 mm) of the resin layer 2 as two times or greater than the thickness $t_2$ (approximately 50 $\mu$m) of the conductive mesh 3, and the thickness $t_3$ of the resin which covered the one side 3b of the conductive mesh was approximately 20 $\mu$m which was less than the thickness $t_2$ of the conductive mesh 3. In addition, on the peripheral section of this laminated sheet 1, one side 3a of the conductive mesh 3 was imbedded and fixed in the resin layer 2, the other side 3b was not imbedded within the resin layer 2, and the exposed portions 3' of the conductive mesh are exposed from the resin layer 2. Moreover, the section in which the exposed portions 3' of the conductive mesh 3 are exposed from the resin layer 2 corresponds to the position of the sand blasted section 11 of the bottom stainless steel plate 10.

The section of the laminated sheet 1 other than the peripheral section had a specular surface due to the impression of the specular surface of the molding plate 10. In addition, in the laminated sheet 1, there was no disturbance to the mesh of the conductive mesh 3, and the laminated sheet 1 was superior from the point of view of being able to see through it.

The laminated sheet 1 was cut to a size of 50 cm×50 cm, and electrical resistance was measured (over an interval of 50 cm) for the conductive mesh 3 exposed from the surface, the result was 1.0Ω.

As explained above, the laminated sheet and manufacturing method of the present invention give the following effects.

i) The manufacturing method of the laminated sheet of the present invention does not require an adhesive or a laminating film. Consequently, the manufacture of the laminated sheet is easy. In addition, since it is possible to manufacture the laminated sheet without the use of an adhesive or the like, the properties of the thermoplastic resin sheet and the conductive mesh-like sheet can be maintained as they are. Consequently, it is possible to manufacture a laminated sheet having electromagnetic wave shielding properties which is not only excellent in electromagnetic wave shielding effects, but is also excellent in its transparency, flexibility, rigidity, endurance, and the like.

ii) By means of the manufacturing method for the laminated sheet of the present invention, it is possible to easily manufacture a laminated sheet formed in such a way that one surface thereof is divided into a section in which portions of the conductive mesh are exposed and a section in which the conductive mesh is covered by resin.

iii) According to the present invention, simply by means of varying the applied pressure, it is possible to manufacture a laminated sheet in which portions of the conductive mesh are exposed across one entire surface. Consequently, it is possible to easily manufacture a laminated sheet which can be grounded easily.

iv) Since pressure is applied to the conductive mesh-like sheet and the thermoplastic resin sheet when the thermoplastic resin sheet is in a rubbery state due to thermosoftening, the shape of the net of the conductive mesh-like sheet is maintained. In addition, it is possible to expose one side of the conductive mesh-like sheet at a uniform height across the entire surface and it is possible to uniformly embed the other side of the conductive mesh in the resin. Consequently, the laminated sheet of the present invention has excellent optical properties such that an image seen through the laminated sheet is not distorted.

v) In the external surface of the laminated sheet, a part of the conductive mesh is exposed, the conductive mesh (for example, in the center) which does not exist in the external section is completely imbedded within the resin layer and, therefore, it is easy to manufacture a product which has surface protection. Consequently, it is possible to manufacture a laminated sheet which is suitable for use as a window material.

What is claimed is:

1. A laminated sheet comprising a conductive mesh and at least one thermoplastic resin layer, wherein the conductive mesh consists of conductive fibers, and wherein a part of said conductive mesh is imbedded in said thermoplastic resin layer, and a part of fibers forming cross points of the conductive fibers of said conductive mesh are exposed from said thermoplastic resin layer, wherein said thermoplastic resin is at least one resin selected from the group comprising methacrylate resin, olefin elastomer, and lead-containing acrylic resin.

2. A laminated sheet according to claim 1, wherein a part of said fibers are exposed from said thermoplastic resin layer on 50% or more of the number of cross points of the conductive fibers of said conductive mesh.

3. A laminated sheet according to claim 1, wherein said thermoplastic resin comprises (A) 10 to 90 parts by weight of the acrylic resin which has principally methyl methacrylate units and an intrinsic viscosity of between 0.1 to 0.35 dl/g measured in chloroform at 20° C.; and (B) 90 to 10 parts by weight of a hydrogenate of a block copolymer which has (a) polymer block comprising aromatic vinyl compound and (b) polymer block comprising isoprene and/or butadiene.

4. A laminated sheet according to claim 1, wherein said sheet is an electromagnetic shielding sheet.

5. A laminated sheet according to claim 1, wherein a thickness of said conductive mesh is approximately 20 to 180 $\mu$m.

6. A laminated sheet comprising a conductive mesh and at least one thermoplastic resin layer, wherein the conductive mesh consists of conductive fibers, and wherein both sides of said conductive mesh are imbedded within one of said at least one thermoplastic resin layer, a thickness of said thermoplastic resin layer is two times or greater than a thickness of said conductive mesh, and a thickness of resin which covers one side of said conductive mesh is less than said thickness of said conductive mesh, wherein said thermoplastic resin is at least one resin selected from the group comprising methacrylate resin, olefin elastomer, and lead-containing acrylic resin.

7. A laminated sheet according to claim 6, wherein said thickness of said resin which covers said one side of said conductive mesh is between 0.005 to 0.03 mm.

8. A laminated sheet according to claim 6, wherein said sheet is an electromagnetic shielding sheet.

9. A laminated sheet comprising a conductive mesh and at least one thermoplastic resin layer, wherein the conductive mesh consists of conductive fibers and wherein one side of said conductive mesh is imbedded within said thermoplastic resin layer, a thickness of said resin layer is two times or greater than a thickness of said conductive mesh, and another side of said conductive mesh is divided into a section which is imbedded within said thermoplastic resin layer and covered by resin, and a section in which portions of said conductive mesh are exposed from said thermoplastic resin layer, wherein said thermoplastic resin is at least one resin selected from the group comprising methacrylate resin, olefin elastomer, and lead-containing acrylic resin.

10. A laminated sheet according to claim 9, wherein a thickness of said resin which covers the other side of said conductive mesh is less than said thickness of said conductive mesh.

11. A laminated sheet according to claim 10, wherein said thickness of said resin which covers said other side of said conductive mesh is between 0.005 to 0.03 mm.

12. A laminated sheet according to claim 9, wherein said sheet is an electromagnetic shielding sheet.

13. A laminated sheet according to claim 9, said section in which portion of conductive mesh are exposed from said thermoplastic resin layer is formed on the peripheral surface of laminated sheet.

14. A laminated sheet according to claim 13, further comprising an earthing terminal which is connected to said section in which portion of conductive mesh are exposed from said thermoplastic resin layer.

15. A laminated sheet wherein at least one side of a conductive mesh sheet consisting of conductive fibers has been imbedded within a thermoplastic resin sheet by means of the application of pressure from one side of said thermoplastic resin sheet when said thermoplastic resin sheet is in a thermosoftened state, and at least one side of conductive mesh is imbedded within a resin layer which has a thickness which is two times or greater than a thickness of said conductive mesh and which has uniform thermal properties, wherein said thermoplastic resin is at least one resin selected from the group comprising methacrylate resin, oletin elastomer, and lead-containing acrylic resin.

16. A laminated sheet according to claim 15 wherein said laminated sheet was formed into a section in which both sides of said conductive mesh are imbedded in said resin layer, and a section in which one side of said conductive mesh is imbedded within said resin layer and the other side of said conductive mesh is exposed from said resin layer, when said conductive mesh sheet was imbedded in said thermoplastic resin sheet by means of the application of pressure.

17. A laminated sheet according to claim 16, wherein said section in which one side of said conductive mesh is imbedded within said resin layer and the other side of said conductive mesh is exposed from said resin layer is formed on the peripheral surface of laminated sheet.

18. A laminated sheet according to claim 17, further comprising an earthing terminal which is connected to said section in which one side of said conductive mesh is imbedded within said resin layer and the other side of said conductive mesh is exposed from said resin layer.

19. A laminated sheet according to claim 15, wherein said sheet is an electromagnetic shielding sheet.

* * * * *